(12) United States Patent
Davies et al.

(10) Patent No.: US 6,329,846 B1
(45) Date of Patent: Dec. 11, 2001

(54) CROSS-COUPLED DUAL RAIL DYNAMIC LOGIC CIRCUIT

(75) Inventors: Andrew Douglas Davies; Daniel Lawrence Stasiak, both of Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/552,935

(22) Filed: Apr. 20, 2000

(51) Int. Cl.$^7$ .................. H03K 19/094; H03K 19/096
(52) U.S. Cl. .................. 326/121; 326/98; 326/95; 326/93
(58) Field of Search .................. 326/17, 26, 27, 326/93, 95, 98, 112, 119, 121, 83, 86, 56–58; 327/55, 67, 312, 313

(56) References Cited

U.S. PATENT DOCUMENTS

| | | | |
|---|---|---|---|
| 5,488,319 | * | 1/1996 | Lo .................................. 326/115 |
| 5,550,490 | * | 8/1996 | Durham et al. .................. 326/98 |
| 6,087,854 | * | 7/2000 | Potter .............................. 326/83 |
| 6,090,153 | * | 7/2000 | Chen et al. ...................... 716/8 |
| 6,133,761 | * | 10/2000 | Matsubara ...................... 326/121 |
| 6,161,166 | * | 12/2000 | Doing et al. .................... 711/125 |

OTHER PUBLICATIONS

Mark N. Horenstein, Microelectronic Circuits And Devices. 1996 by Printice–Hall, INc.*

* cited by examiner

Primary Examiner—Michael Tokar
Assistant Examiner—Vibol Tan
(74) Attorney, Agent, or Firm—Roy W. Truelson (57) ABSTRACT

Logic functions using dual rail dynamic logic circuits are implemented by cross-coupling a pair shunt transistors to the outputs. Preferably, the precharge nodes provide input to the gates of respective inverter drivers, each inverter formed as a p-channel field-effect transistor (pFET) and an n-channel field-effect transistor (nFET). The circuit's logic functions discharge the precharge nodes to ground. Therefore, one of the precharge nodes discharges to ground, while the other retains its positive precharge. The inverter drivers drive the discharged precharge node high, while the precharge node which retains its original charge is driven low. The shunt transistors are nFETs which connect the outputs of the inverter drivers to ground. The gate of each shunt transistor is driven by the output of the opposite inverter driver. The output which is driven by a discharged precharge node is relatively immune from noise, since there is a path from the precharge node to ground through several open transistors. The output driven by the discharged precharge node will turn on the shunt transistor for the complementary output, bringing that output to the correct logic value even if noise is present. The shunts only conduct current where noise has affected one of the outputs, and therefore there is no appreciable increase in power consumption. Furthermore, in the absence of noise, the shunts have negligible effect on circuit switching speed.

14 Claims, 6 Drawing Sheets

CROSS-COUPLED DUAL RAIL DYNAMIC LOGIC CIRCUIT

FIELD OF THE INVENTION

The present invention relates to digital logic devices, and in particular to dynamic logic circuits used in digital devices.

BACKGROUND OF THE INVENTION

A modern computer system typically comprises a central processing unit (CPU) and supporting hardware necessary to store, retrieve and transfer information, such as communications buses and memory. It also includes hardware necessary to communicate with the outside world, such as input/output controllers or storage controllers, and devices attached thereto such as keyboards, monitors, tape drives, disk drives, communication lines coupled to a network, etc. The CPU is the heart of the system. It executes the instructions which comprise a computer program and directs the operation of the other system components.

From the standpoint of the computer's hardware, most systems operate in fundamentally the same manner. Processors are capable of performing a limited set of very simple operations, such as arithmetic, logical comparisons, and movement of data from one location to another. But each operation is performed very quickly. Programs which direct a computer to perform massive numbers of these simple operations give the illusion that the computer is doing something sophisticated. What is perceived by the user as a new or improved capability of a computer system is made possible by performing essentially the same set of very simple operations, but doing it much faster. Therefore continuing improvements to computer systems require that these systems be made ever faster.

The overall speed of a computer system (also called the throughput) may be crudely measured as the number of operations performed per unit of time. Conceptually, the simplest of all possible improvements to system speed is to increase the clock speeds of the various components, and particularly the clock speed of the processor(s). E.g., if everything runs twice as fast but otherwise works in exactly the same manner, the system will perform a given task in half the time. Early computer processors, which were constructed from many discrete components, were susceptible to significant speed improvements by shrinking component size, reducing component number, and eventually, packaging the entire processor as an integrated circuit on a single chip. The reduced size made it possible to increase clock speed of the processor, and accordingly increase system speed.

Despite the enormous improvement in speed obtained from integrated circuitry, the demand for ever faster computer systems has continued. Speed increases may be obtained from improvements at nearly every level of computer design, from the high level architecture of the system to the level of the individual circuits themselves.

One innovation that has been attempted in recent years is dual rail dynamic logic circuitry. A dynamic logic circuit operates by charging a precharge node (which serves as a gate to a driver) during one phase of a clock, and evaluating the logic value of the circuit during a second phase of the clock. During the evaluation phase, the node is either discharged to ground, or not discharged (allowed to retain its original positive charge), depending on the logic values of the inputs. Dual rail dynamic logic uses complementary sets of inputs for discharging separate precharge nodes, to produce two complementary outputs, which in turn serve as inputs to the next logic stage.

Dual rail dynamic logic provides improved speed over standard dynamic logic, which in turn provides improved speed over static logic. However, like most innovations, dual rail dynamic logic comes with a price. Obviously, additional transistors and wires are needed to implement a dual rail design of the same logic circuitry. Dynamic logic is, by its nature, potentially susceptible to noise, due to the reliance on a small charge in the precharge node to place the output driver in the correct state when the precharge node is not discharged in the evaluation phase. The proliferation of wires and precharge nodes makes dual rail designs significantly more susceptible to noise It would be desirable to obtain the speed advantages of dual rail dynamic logic without the noise sensitivity of conventional dual rail dynamic logic designs.

SUMMARY OF THE INVENTION

Logic functions using dual rail dynamic logic circuits are implemented by cross-coupling a pair shunt transistors to the outputs.

In the preferred embodiment, the precharge nodes provide input to the gates of respective inverter drivers, each inverter driver formed using CMOS technology as a p-channel field-effect transistor (pFET) and an n-channel field-effect transistor (nFET). The circuit's logic functions discharge the precharge nodes to ground. Therefore, one of the precharge nodes discharges to ground, while the other retains its positive precharge. The inverter drivers drive the discharged precharge node high, while the precharge node which retains its original charge is driven low. The shunt transistors are nFETs which connect the outputs of the inverter drivers to ground. The gate of each shunt transistor is driven by the output of the opposite inverter driver.

In dual rail dynamic logic, it is always the case that one of the outputs is driven by a discharged precharge node, while the other is driven by a precharge node which retains its original charge. In the preferred embodiment, the output which is driven by a discharged precharge node is relatively immune from noise, since there is a path from the precharge node to ground through several open transistors. The output driven by the discharged precharge node will turn on the shunt transistor for the complementary output, bringing that output to the correct logic value even if noise is present. The shunts only conduct current where noise has affected one of the outputs, and therefore there is no appreciable increase in power consumption. Furthermore, in the absence of noise, the shunts have negligible effect on circuit switching speed.

The details of the present invention, both as to its structure and operation, can best be understood in reference to the accompanying drawings, in which like reference numerals refer to like parts, and in which:

DETAILED DESCRIPTION OF THE PREFERRED EMBODIMENT

Figure 1:
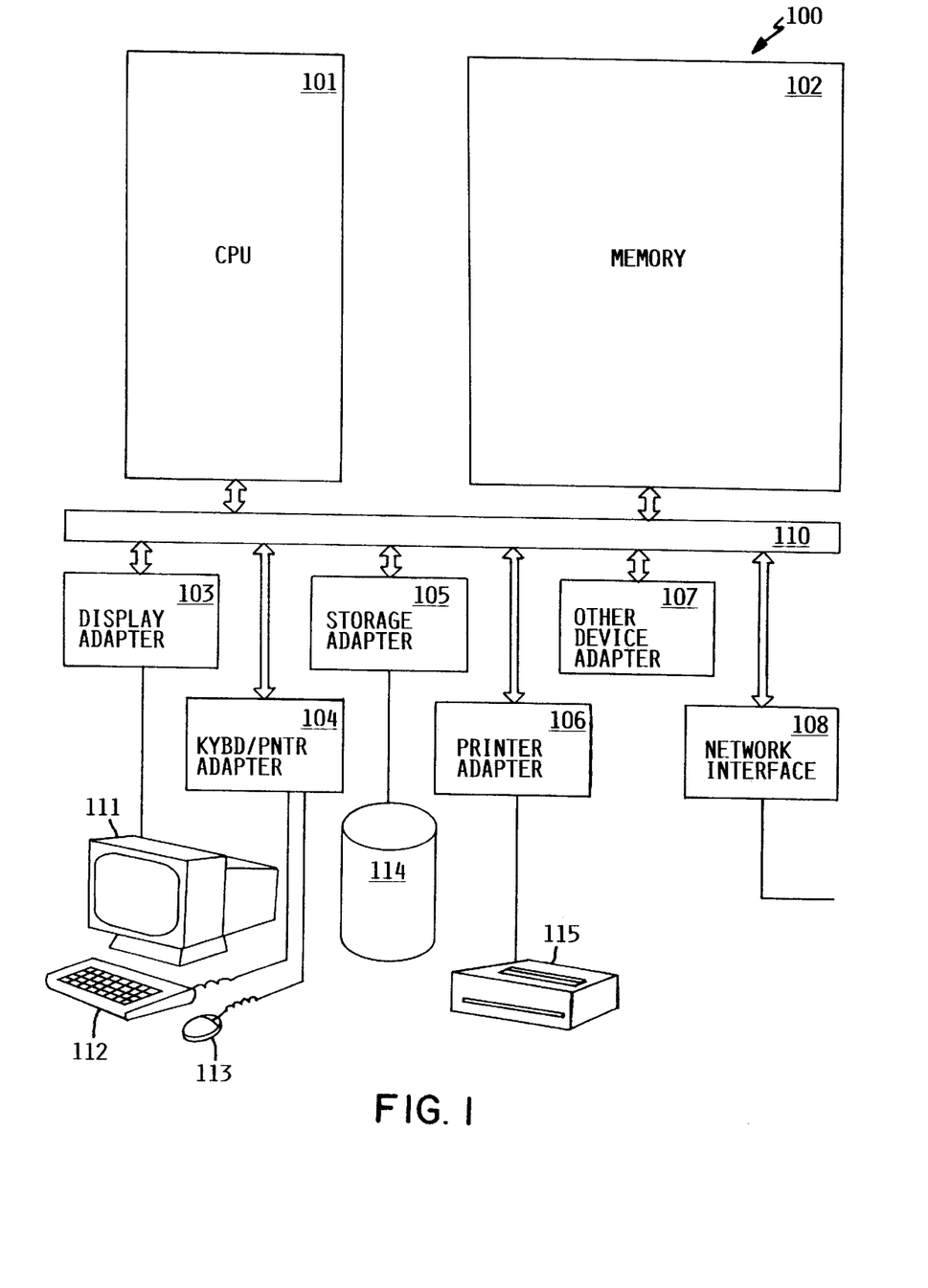
FIG. 1 shows the major hardware components of a typical computer system for utilizing dual rail dynamic logic circuitry, according to the preferred embodiment of the present invention.

Referring to the Drawing, wherein like numbers denote like parts throughout the several views, FIG. 1 is a high-level block diagram of a typical computer system 100 for utilizing multiple dual rail dynamic logic circuits, according to the preferred embodiment. Computer system 100 includes CPU 101, main memory 102, various device adapters and interfaces 103–108, and communications bus 110. CPU 101 is a general-purpose programmable processor, executing instructions stored in memory 102; while a single CPU is shown in FIG. 1, it should be understood that computer systems having multiple CPUs could be used. Memory 102 is a random-access semiconductor memory for storing data and programs; memory is shown conceptually as a single monolithic entity, it being understood that memory is often arranged in a hierarchy of caches and other memory devices. Communications bus 110 supports transfer of data, commands and other information between different devices; while shown in simplified form as a single bus, it may be structured as multiple buses, and may be arranged in a hierarchical form. Display adapter 103 supports video display 111, which is typically a cathode-ray tube display, although other display technologies may be used. Keyboard/pointer adapter 104 supports keyboard 112 and pointing device 113, depicted as a mouse, it being understood that other forms of input devices could be used. Storage adapter 105 supports one or more data storage devices 114, which are typically rotating magnetic hard disk drives, although other data storage devices could be used. Printer adapter 106 supports printer 115. Adapter 107 may support any of a variety of additional devices, such as CD-ROM drives, audio devices, etc. Network interface 108 provides a physical interface to an external network, such as the Internet. Computer system 100 may be any of various models of single-user computer systems known as "personal computers". However, computer system 100 may alternatively be a larger computer system for servicing multiple users, having multiple attached terminals or being connected to multiple other computer systems through remote communications lines, local area networks, and the like. The representation of FIG. I is intended as an exemplary simplified representation of a computer system 100, it being understood that many variations in system configuration are possible in addition to those mentioned here.

As will be understood by those skilled in the art, digital logic circuits are the basic building blocks of a great variety of digital devices, of which computers are only the most outstanding example. The dual rail dynamic logic circuitry as described herein could be used in any of a variety of digital logic applications, not all of which would necessarily be considered "computer systems". For example, such digital logic circuits may be found in special purpose control systems found in automobiles, aircraft, robotic machinery, appliances, etc. Because it is anticipated that the greatest need for high speed and noise immunity provided by the dual rail logic circuitry described herein will be encountered in high-speed processors of general purpose digital computer systems, the preferred embodiment of the present invention has been described in that context. The invention should not necessarily be limited to the context of computer systems or computer system processors.

Figure 2:
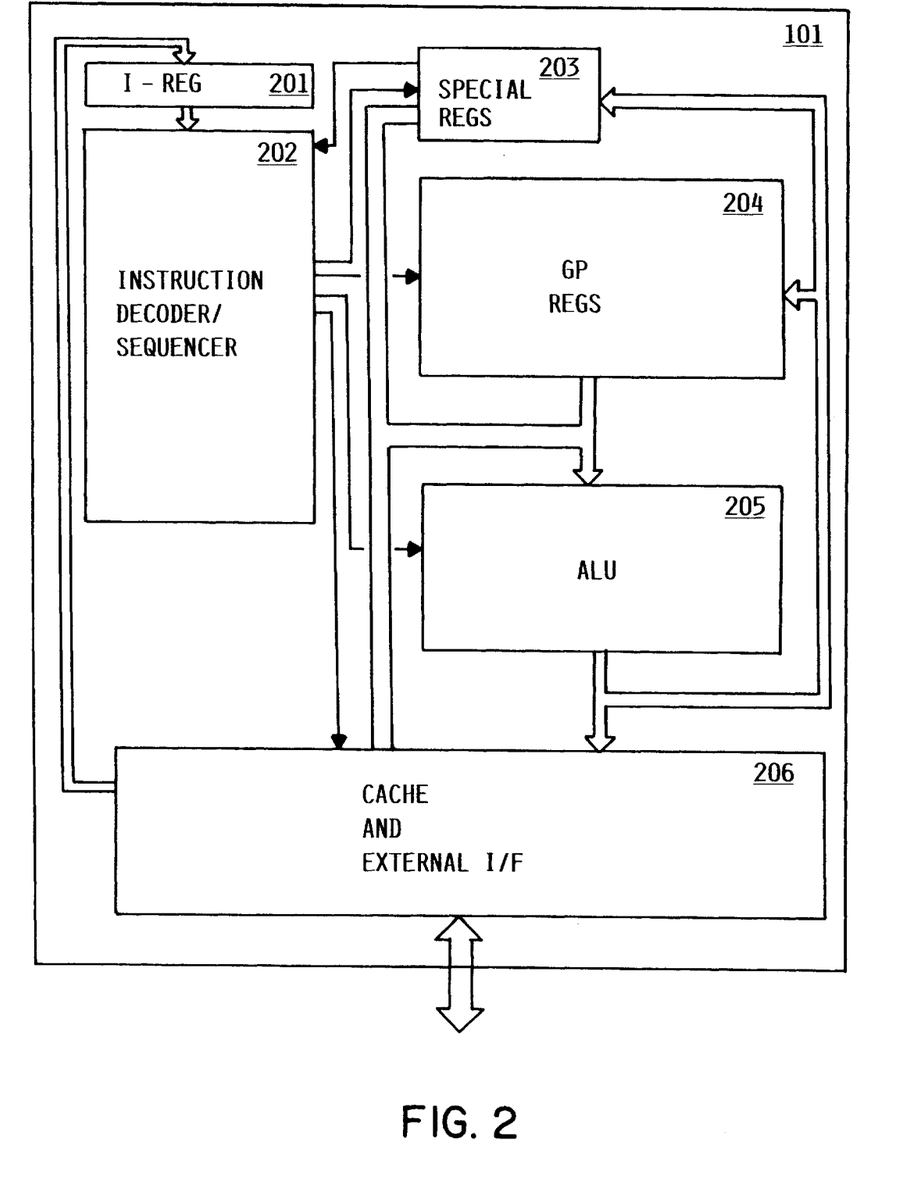
FIG. 2 is a high-level block diagram of the major components of a typical central processing unit of a computer system for utilizing dual rail dynamic logic circuitry, according to the preferred embodiment.

FIG. 2 is a high-level block diagram of the major components of a typical central processing unit 101 of computer system 100. CPU 101 contains instruction register 201 for holding the current instruction being executed. I-reg 201 provides input to instruction decoder/sequencer 202. Decoder/sequencer decodes the instruction in I-reg 201 to determine the operation(s) to be performed. At the same time, it determines the address of the next instruction to execute; it may do this by incrementing the current address, or it may receive input from one or more special registers 203 to determine whether a branch condition is met. General purpose registers 204, special purpose registers 203, and/or cache 206 may provide input to arithmetic logic unit 205 to perform a required operation. The result of the operation may be stored in special registers 203, general purpose registers 204, and/or cache 206. Cache and external interface unit 206 communicates with external devices, particularly memory or other caches, to provide instructions and data to processor 101, or to store data which has been generated by processor 101 in memory.

As will be appreciated, a typical processor 101 requires a great deal of digital logic. While each unit above described requires some logic, instruction decoder/sequencer 202 and ALU 205 in particular require substantial digital logic circuitry to perform complex logical functions; the speed at which such circuitry operates is critical to the speed of the processor, and ultimately, the speed of computer system 100 as a whole.

Where a processor or other digital logic device employs a dual rail dynamic logic design, it performs multiple complex logic functions using multiple dual rail dynamic logic cells, the outputs of some cells being coupled to the inputs of others. Each individual cell performs a primitive logic function, such and AND, OR, etc. The nature of a dual rail design requires that all inputs be provided in both the uncomplemented and complemented form. The dual rail dynamic logic cell always has two outputs, one being the complement of the other. Thus, where the outputs of one or more dual rail logic cells serve as inputs to another cell, the complemented forms of the inputs arc already available (without the need for an additional inverter). Because dual rail dynamic cells provide both forms of output without the need for inverting, it is normally expected that substantially all the logic in a particular device will be dual rail dynamic logic, or that none of it will. There may be circumstances where input to a dual rail dynamic logic cell is taken from something other than another dual rail dynamic logic cell, possibly requiring an additional inverter.

Figure 3:
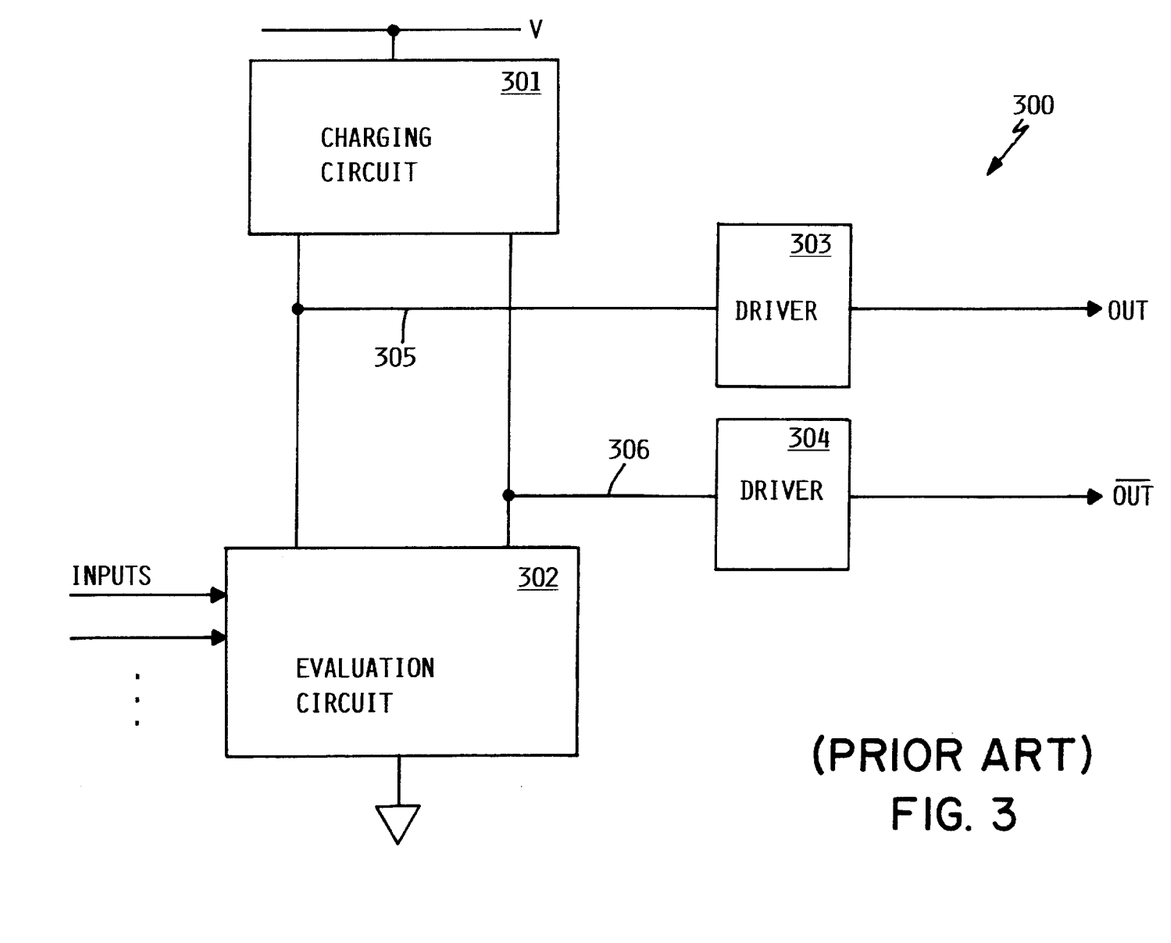
FIG. 3 is a high level block diagram of a prior art dual rail dynamic logic cell

FIG. 3 is a high level block diagram of a dual rail dynamic logic cell 300, according to the prior art. Cell 300 contains charging circuit 301 which is connected to a voltage source, for charging a pair of precharge nodes 305, 306 from the voltage source during a first phase of a clock. Cell 300 further contains evaluation circuit 302, which is coupled to precharge nodes 305, 306. Evaluation circuit receives logic inputs, and selectively discharges one of precharge nodes 305, 306 to ground during a second phase of a clock, the precharge node being selected for discharge depending upon the values of the inputs. Each precharge node 305, 306 is coupled to the input side of respective high input impedance driver 303, 304, which drive a pair of output lines. The high input impedance drivers 303, 304 are necessary to avoid discharging nodes 305, 306 from downstream circuit elements (not shown). The logic within evaluation circuit 302 is constructed so that one and only one of precharge nodes 305, 306 is discharged during the second clock phase, the other node retaining its original (logic '1') charge. Drivers 303, 304 may be either inverting or non-inverting, but both drivers are the same (either both inverting, or both non-inverting). As a result, the two output lines from drivers 303, 304 will be complementary.

Figure 4:
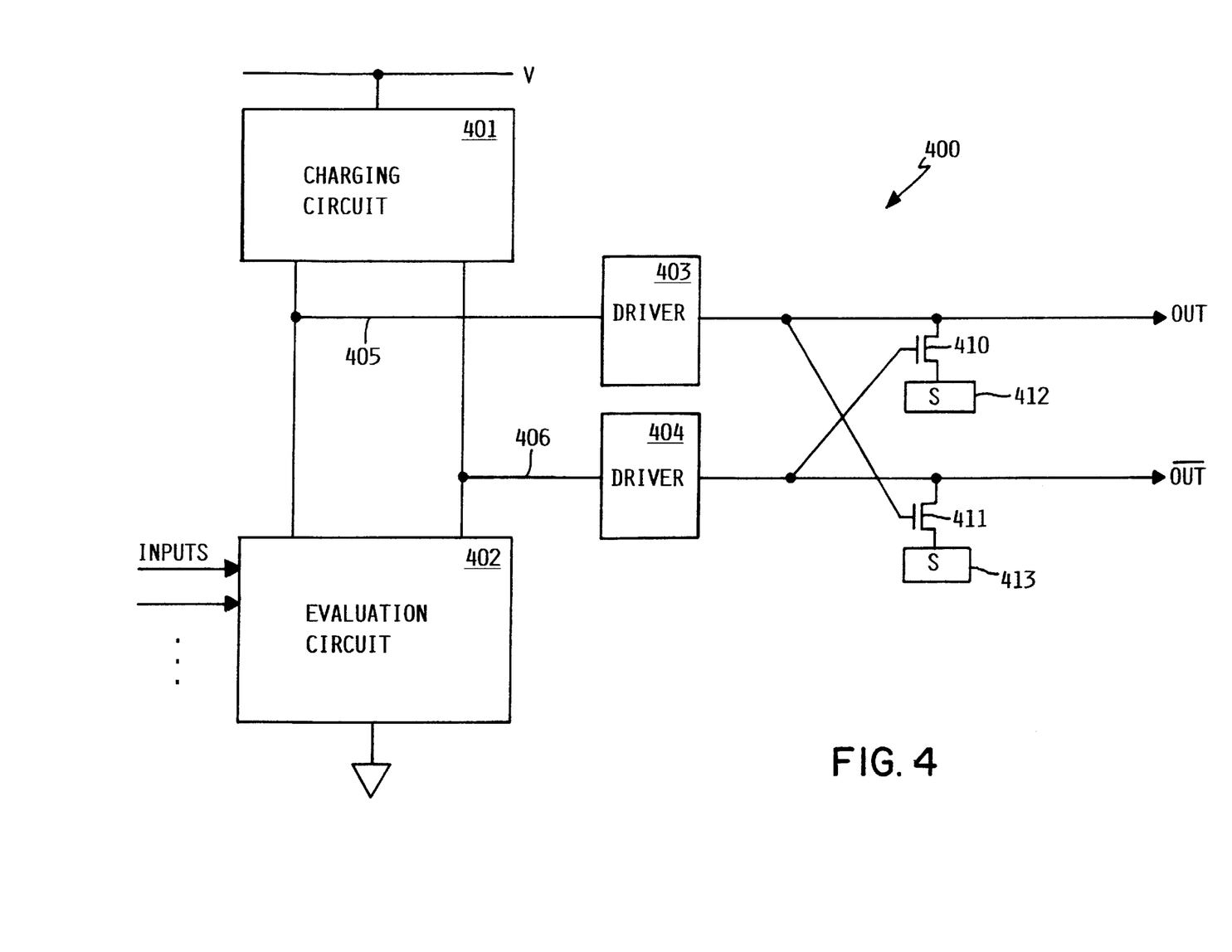
FIG. 4 is a high level block diagram of a dual rail dynamic logic cell having improved noise immunity, according to the preferred embodiment.

FIG. 4 is a high level block diagram of a dual rail dynamic logic cell having improved noise immunity, according to the preferred embodiment. As in the prior art circuit of FIG. 3, charging circuit 401 charges precharge nodes 405,406 during a first clock phase. Evaluation circuit 402 selectively discharges one of precharge nodes 405, 406 during a second clock phase, the node being selected for discharge being dependent on the values of the inputs. High input impedance drivers 403, 404 drive the complementary values of the precharge nodes on the pair of output lines.

In accordance with the preferred embodiment, shunt transistor 410 is connected between the output of driver 403 and a sink 412. The gate of shunt transistor 410 is connected to the output of driver 404. Likewise, shunt transistor 411 is connected between the output of driver 404 and sink 413. The gate of shunt transistor 411 is connected to the output of driver 403. I.e., shunt transistors 410, 411 are "cross-coupled" to the outputs.

In the preferred embodiment, drivers 403, 404 are inverting drivers, and sinks 412, 413 are simple grounds. In operation, evaluation circuit discharges one of nodes 405, 406 to ground during the second clock phase. For simplicity of illustration, it will be assumed that node 405 is discharged, it being understood that the circuit would operate in an analogous manner if node 406 were discharged. Discharging means that there is a low impedance circuit path through one or more open transistors from node 405 to ground, more than sufficient to drive node 405 to ground even in the presence of some noise. Driver 403 (which is preferably inverting) therefore drives its output high. The high output is coupled to the gate of shunt transistor 411, thus opening the transistor and holding the output line of driver 404 low. This output line will be held low even in the presence of some noise which may affect the charge on precharge node 406.

Figure 5:
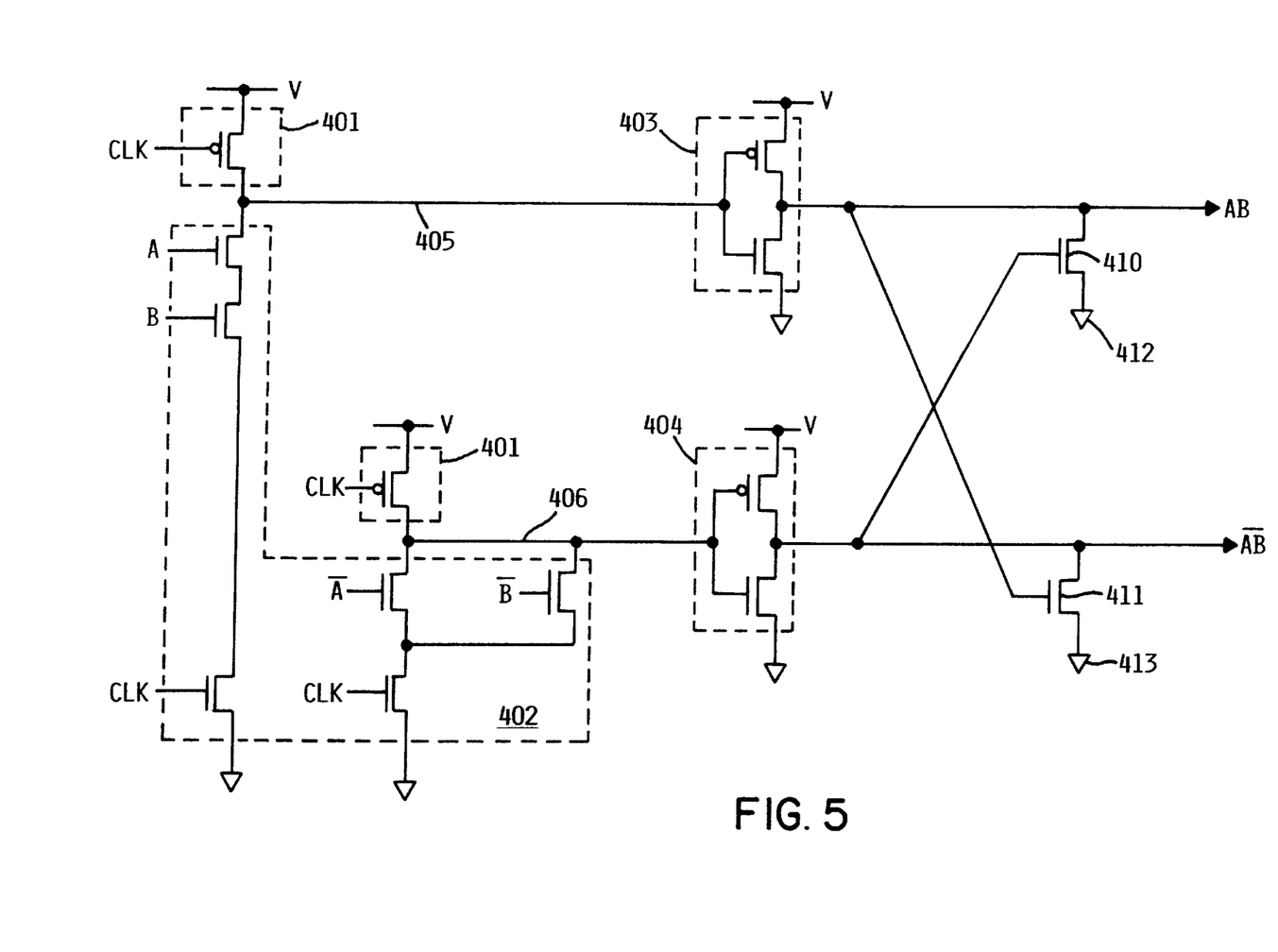
FIG. 5 is an example implementation of a dual rail dynamic logic circuit cell in greater detail, according to the preferred embodiment.

FIG. 5 is an example implementation of a dual rail logic circuit cell in greater detail, according to the preferred embodiment. In this example, the cell performs a logical AND of two inputs, A and B. Because dual rail dynamic logic provides both uncomplemented and complemented outputs, the cell of FIG. 5 is both an AND logic cell and a NAND logic cell.

As shown in FIG. 5, the charging circuit in the exemplary embodiment is a pair of pFETs connected between a voltage supply at logic '1' and the precharge nodes 405,406, one pFET for each precharge node. The gates of the pFETs are connected to a clock signal (CLK), so that the pFETs are open and charge the precharge nodes when the CLK signal is low. The inputs to the evaluation circuit are A, ¬A, B and ¬B. Additionally, the CLK signal is used. Node 405 discharges to ground through a three nFETs connected in series, gated by input signals A and B, and CLK signal. When CLK is high (the evaluation phase of the clock), and A and B are also high, node 405 discharges to ground; otherwise, it remains at the precharge state. Discharging node 405 to ground causes the output of inverter driver 403 to go high, and thus the output of this driver represents the logical AND of A and B. Similarly, precharge node 406 discharges to ground through a pair of nFETS connected in parallel and gated by input signals ¬A and ¬B, which are collectively connected in series with a single nFET gated by CLK signal. If either ¬A or ¬B is high (i.e., either A is low or B is low), precharge node 406 will discharge to ground during the evaluation phase (when CLK is high). Inverting driver 404 will then drive its output line high, and therefore the output of inverting driver 404 represents a logical NAND of inputs A and B.

Each driver 403 and 404 is an inverters constructed from a pair of one pFET and one nFET, the pFET and nFET being gated by the associated precharge node. The pFET is connected to a voltage supply at logic '1', and is open to impose logic '1' on the output line when the precharge node is negative. The nFET is connected to ground, and is open to pull the output to ground when the precharge node is positive.

The shunt transistors 410, 411 are, in this embodiment, nFETs which are connected between the output lines and ground (the "sinks" 412, 413 in this exemplary embodiment being grounds). A shunt nFET is open when the output of the opposite driver is driven high, therefore pulling its output low.

Figure 6:
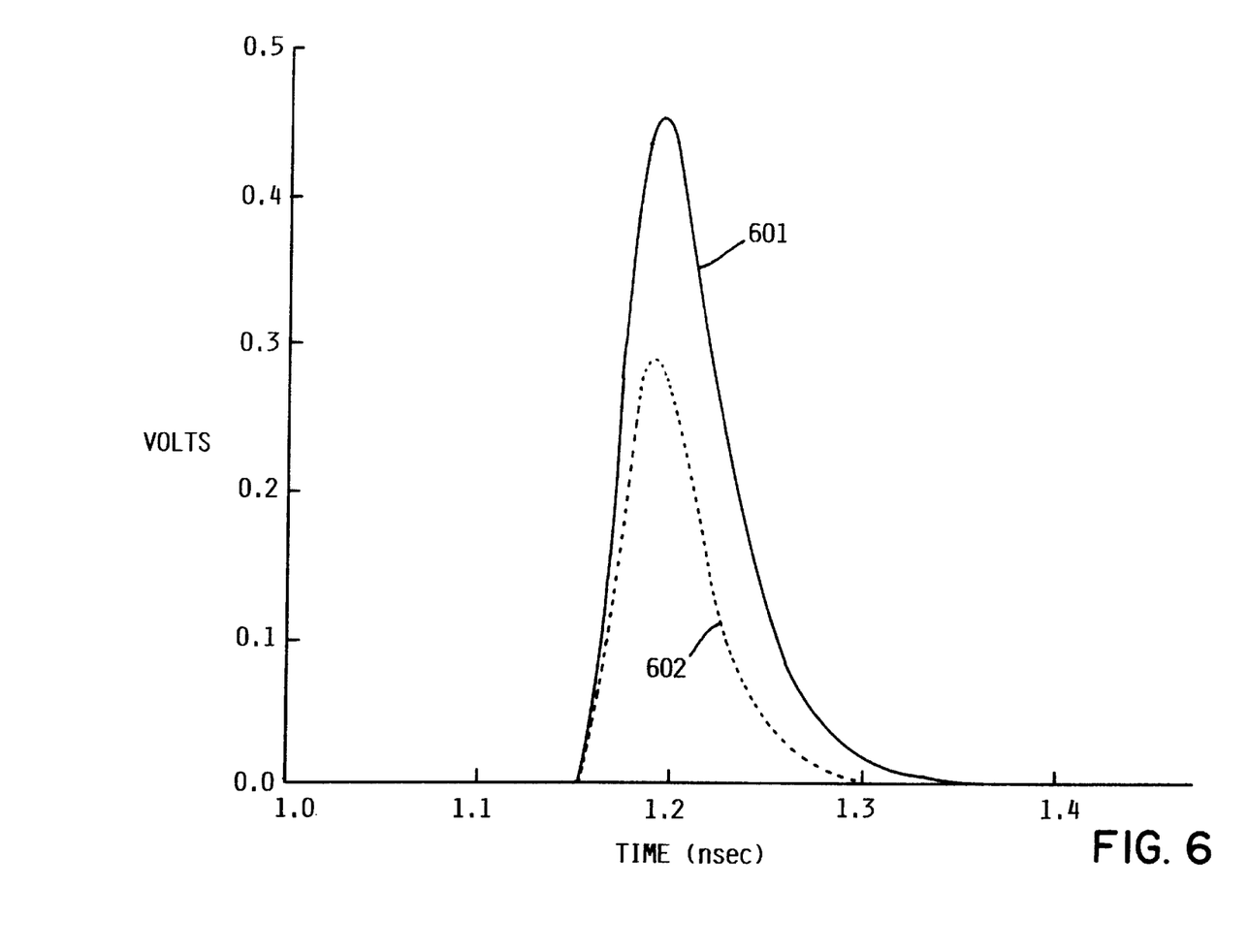
FIG. 6 illustrates simulated wave forms for a prior art dual rail dynamic logic circuit and a dual rail dynamic logic circuit according to the preferred embodiment, in the presence of a noise pulse.

FIG. 6 illustrates mathematically modeled wave forms for a prior art dual rail dynamic logic circuit and a dual rail dynamic logic circuit according to the preferred embodiment, in the presence of noise. In this simulation, it is assumed that a CMOS8S2 silicon-on-insulator technology is used, having a nominal voltage of 1.5 volts, an L effective of 0.08 microns (for nFET), and a T oxide of 2.3 nanometers. The simulation is done under stress conditions of 2.25 volts and 70° C. A dual rail dynamic cell driver drives a 1 mm wire in the M3 layer, feeding another dual rail dynamic cell.

FIG. 6 represents the voltage on the output line of a single driver, e.g., driver 304 (for the prior art curve) or driver 404 (for the curve of the preferred embodiment of the invention). It is assumed that a pair of similar driver output lines lie adjacent the output line of driver 304 or 404, and that at time t=1.15 nsec, both of these adjacent lines go high simultaneously, while the output of the line driven by driver 304 or 404 should remain at ground. Under these conditions, the solid line 601 in FIG. 6 represents the noise pulse induced on the output line of driver 304, while the broken line 602 represents the noise pulse on the output line of driver 404 according to the preferred embodiment. As can be seen, the simulation predicts a noise pulse of approximately 0.45 volts on the prior art output line, while the noise pulse is reduced to approximately 0.29 volts on the output line of the preferred embodiment, a significant reduction. It will be appreciated that the exact amount of noise reduction may vary depending on numerous circuit parameters and operating conditions.

In the preferred embodiment, drivers 403, 404 are inverting drivers, sinks 412, 413 are grounds, and shunt transistors 410, 411 are pull-down nFETs which open to pull an output line to ground when the gate is high (logic '1'). However, it will be appreciated that a dual rail dynamic logic cell could alternatively be designed with non-inverting drivers and pull-up transistors cross-coupled to the outputs. I.e., drivers 403,404 could be non-inverting, and sinks 412, 413 could be a supply voltage at logic '1', rather than ground. In this case, shunt transistors 410,411 would preferably be pFET transistors which open to pull an output line high when the gate of the transistor is low. The circuit would operate in an analogous manner to that described above. I.e., if node 405 were discharged, driver 403 (non-inverting) would drive its output line low. The low output would be coupled to the gate of pFET 411, which would open pFET 411 to sink 413, which in this alternative embodiment is asssumed to be a supply voltage at logic '1'. This would pull the output of driver 404 high, even in the presence of some noise which may disrupt the charge on node 406.

While sinks 412, 413 have been described above as either grounds or supply voltage at logic '1', it should further be understood that sinks 412, 413 may involve additional circuitry (not shown). Furthermore, it would be possible to interpose additional circuit elements between the shunt transistors and the output lines, provided these have sufficiently low impedance during output clock phases, or to interpose additional circuit elements in the cross-coupling lines.

Various circuit embodiments have been shown in the figures, but it will be understood that there are a large number of possible permutations within the spirit and scope of the present invention. Specifically, a charging circuit 401 may be anything that will charge the precharge nodes before the evaluation phase of the clock. A charging circuit may have other or additional circuit elements than the pair of pFETs shown in the example of FIG. 5. As one variation, a charging circuit could be a pair of nFET gated by the complement of the clock signal used for evaluation, or by another clock signal, one which is always out of phase with the clock signal used for evaluation. It would also be possible to employ more complex charging circuits, which, for example, might use some of the inputs to shut off charging of the precharge nodes.

In the example of FIG. 5, drivers 403, 404 are simple CMOS inverters, each consisting of a pair of one pFET and one nFET. As previously stated, these could alternatively be non-inverting drivers. Additionally, there are numerous variations in the design of driver circuits, either inverting or non-inverting, which could be used.

In the example of FIG. 5, the evaluation circuit implements a simple 2-input AND. It will be appreciated that in general, an evaluation circuit may implement a different logic function and/or a function having a different number of inputs, and that configuration of circuit elements may vary. As one variation, the series pair of nFETs connected to node 405 and the parallel pair of nFETS connected to node 406 could be connected to a common nFET gated by CLK signal, rather than to the separate nFETs gated by the CLK signal shown in FIG. 5.

A simple circuit cell has be illustrated in the example of FIG. 5 for clarity of illustration of the basic concepts of the present invention. However, a dynamic logic cell may have additional elements and features not shown Although a specific embodiment of the invention has been disclosed along with certain alternatives, it will be recognized by those skilled in the art that additional variations in form and detail may be made within the scope of the following claims:

What is claimed is:

1. A dual rail dynamic logic circuit, comprising:
a pair of precharge nodes;
a charging circuit for said pair of precharge nodes;
a first driver circuit and a second driver circuit, one respective driver circuit being coupled to each precharge node;
an evaluation circuit, said evaluation circuit discharging a selected one of said precharge nodes during an evaluation phase of a clock, the precharge node being selected depending on the value of one or more inputs to said evaluation circuit; and a first shunt transistor and a second shunt transistor, said first shunt transistor being connected between the output of said first driver circuit and a sink, said second shunt transistor being connected between the output of said second driver circuit and a sink, wherein the gate of said first shunt transistor is coupled to the output of said second driver circuit, and the gate of said second shunt transistor is coupled to the output of said first driver circuit.

2. The dual rail dynamic logic circuit of claim 1, wherein said sinks comprise a ground.

3. The dual rail dynamic logic circuit of claim 2, wherein said drivers are inverting drivers and said shunt transistors are n-channel field effect transistors (nFETs).

4. The dual rail dynamic logic circuit of claim 2, wherein each said driver is an inverting driver comprising a p-channel field effect transistor (pFFT) and an nFET, the gates of said pFET and said nFET being connected to the precharge node, the pFET being connected between a voltage source and an output of the driver, the nFET being connected between the output of the driver and a ground.

5. The dual rail dynamic logic circuit of claim 1, wherein said charging circuit comprises first and second charging transistors, each charging transistor being connected between a voltage source and a respective precharge node, each charging transistor being gated by a clock signal, wherein each charging transistor is gated open during a precharge phase of said clock, said precharge phase being different from said evaluation phase.

6. The dual rail dynamic logic circuit of claim 1, wherein said evaluation circuit comprises a logic portion comprising at least one transistor gated by a logical input signal, and a clock portion comprising at least one transistor gated by a clock signal, said logic portion being connected in series with said clock portion.

7. The dual rail dynamic logic circuit of claim 6, wherein said evaluation circuit comprises a first logic portion comprising at least one transistor gated by a first logical input signal, said first logic portion for discharging a first precharge node of said pair of precharge nodes, and a second logic portion comprising at least one transistor gated by a second logical input signal, said second logical input signal being a complement of said first logical input signal, said second logic portion for discharging a second precharge node of said pair of precharge nodes.

8. A processor, comprising:
an instruction decoder/sequencer circuit;
a plurality of registers for storing data;
an arithmetic/logic circuit; and
an external interface;
wherein at least some of the logic circuitry of said processor is implemented using a plurality of dual rail dynamic logic cells, each said cell comprising:
(a) a pair of precharge nodes;
(b) a charging circuit for said pair of precharge nodes;
(c) a first driver circuit and a second driver circuit, one respective driver circuit being coupled to each precharge node;
(d) an evaluation circuit, said evaluation circuit discharging a selected one of said precharge nodes during an evaluation phase of a clock, the precharge node being selected depending on the value of one or more inputs to said evaluation circuit; and
(e) a first shunt transistor and a second shunt transistor, said first shunt transistor being connected between the output of said first driver circuit and a sink, said second shunt transistor being connected between the output of said second driver circuit and a sink, wherein the gate of said first shunt transistor is coupled to the output of said second driver circuit, and the gate of said second shunt transistor is coupled to the output of said first driver circuit.

9. The processor of claim 8, wherein said sinks comprise a ground.

10. The processor of claim 9, wherein said drivers are inverting drivers and said shunt transistors are n-channel field effect transistors (nFETs).

11. The processor of claim 9, wherein each said driver is an inverting driver comprising a p-channel field effect transistor (pFET) and an nFET, the gates of said pFET and said nFET being connected to the precharge node, the pFET being connected between a voltage source and an output of the driver, the nFET being connected between the output of the driver and a ground.

12. The processor of claim 8, wherein said charging circuit comprises first and second charging transistors, each charging transistor being connected between a voltage source and a respective precharge node, each charging transistor being gated by a clock signal, wherein each charging transistor is gated open during a precharge phase of said clock, said precharge phase being different from said evaluation phase.

13. The processor of claim 8, wherein said evaluation circuit comprises a logic portion comprising at least one transistor gated by a logical input signal, and a clock portion comprising at least one transistor gated by a clock signal, said logic portion being connected in series with said clock portion.

14. The processor of claim 13, wherein said evaluation circuit comprises a first logic portion comprising at least one transistor gated by a first logical input signal, said first logic portion for discharging a first precharge node of said pair of precharge nodes, and a second logic portion comprising at least one transistor gated by a second logical input signal, said second logical input signal being a complement of said first logical input signal, said second logic portion for discharging a second precharge node of said pair of precharge nodes.

\* \* \* \* \*